(12) United States Patent
Umeno

(10) Patent No.: US 6,233,705 B1
(45) Date of Patent: *May 15, 2001

(54) TEST METHOD FOR DATA STORAGE CHARACTERISTICS OF MEMORY

(75) Inventor: Shigeki Umeno, Kawasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,439

(22) Filed: Dec. 19, 1997

(30) Foreign Application Priority Data

Dec. 27, 1996 (JP) .................................................. 8-351561

(51) Int. Cl.$^7$ .................................................. G11C 29/00
(52) U.S. Cl. ....................................... 714/718; 365/185.22
(58) Field of Search .................................... 714/718, 721, 714/723; 365/201, 222, 185.18, 185.22, 185.24, 224

(56) References Cited

U.S. PATENT DOCUMENTS

| | | | |
|---|---|---|---|
| 5,566,386 | * 9/1996 | Kumakura et al. | 365/226 |
| 5,652,729 | * 7/1997 | Iwata et al. | 365/222 |
| 5,696,773 | * 12/1997 | Miller | 714/745 |
| 5,732,022 | * 3/1998 | Kato et al. | 365/185.24 |
| 5,748,544 | * 5/1998 | Hashimoto | 365/201 |
| 5,835,429 | * 11/1998 | Schwarz | 365/201 |
| 5,844,915 | * 12/1998 | Saitoh et al. | 714/719 |
| 5,903,505 | * 5/1999 | Wik et al. | 365/222 |
| 5,909,404 | * 6/1999 | Schwarz | 365/201 |
| 5,910,922 | * 6/1999 | Huggins et al. | 365/201 |

* cited by examiner

*Primary Examiner*—Albert Decady
*Assistant Examiner*—Guy Lamarre
(74) *Attorney, Agent, or Firm*—Fitzpatrick, Cella, Harper & Scinto

(57) ABSTRACT

There is disclosed a test method for the data storage characteristics of a memory capable of improving the detection efficiency for the memories of defective data storage characteristics, thereby reducing the test time and improving the work efficiency. Test data is written into a non-volatile memory by applying a voltage lower than the rated voltage, then the memory storing the test data is subjected, for a predetermined period, to a test for time-dependent deterioration of the test data, then the test data are read from the memory after the test and there is investigated the $V_G$-$I_D$ characteristics representing the storage characteristics of the test data, whereby the nonvolatile memory is judged satisfactory or defective according to whether the threshold of the $V_G$-$I_D$ characteristics is above or below and evaluation reference voltage.

6 Claims, 5 Drawing Sheets

TEST METHOD FOR DATA STORAGE CHARACTERISTICS OF MEMORY

BACKGROUND OF THE INVENTION

1. Field of the Invention

The present invention relates to a test method for testing the data storage characteristics of a memory such as a non-volatile memory, enabling secure detection of presence of a memory cell with defective memory storage ability.

2. Related Background Art

At first there will be explained, with reference to FIGS. 4 through 8, the conventional method for testing the data storage characteristics of a memory. FIG. 4 is a flow chart of the test process for the data storage characteristics of a non-volatile memory 1 (hereinafter called a "memory cell").

At first, in a step S1 for writing all bit data into the memory, a gate voltage $V_G$ is elevated by a voltage elevation circuit applied to a gate terminal 2 of each memory cell 1. In this state, a source terminal 3 is maintained at 0 V, while a drain terminal 4 is left open. FIG. 8 shows a circuit for applying a voltage to the gate terminal 2 at the data writing. In this state, a rated voltage $V_1$ of the memory cell 1 is applied as the gate voltage $V_G$ to the gate terminal 2, whereby a predetermined amount of negative charge (−) is accumulated in a floating gate 5.

Then, in a step S2, each memory cell with the accumulated charge is left to stand in a high-temperature environment for a predetermined period. In this manner the loss of the charge, accumulated in the floating gate 5 shown in FIG. 6, is accelerated and the change in the charge amount in a prolonged period can be estimated.

Then a step S3 executes the data read-out of the memory cell 1 at a voltage $V_{READ}$. FIG. 7 shows the state of the memory cell 1 at the data reading. The data reading is achieved by detecting the drain current $I_D$ at a drain terminal 4.

FIG. 5 shows the change in the $V_G$-$I_D$ characteristics before and after the high-temperature standing test, wherein a curve 10 indicates the behavior of the drain current $I_D$ under the application of the rated voltage $V_1$ at the gate voltage $V_G$ before the high-temperature standing test, while curves 11, 12 indicates the drain currents $I_D$ after the test.

The curve 11 shows an example of the memory cell with good data storage characteristics. As the charge accumulated in the floating gate 5 is scarcely lost, this curve is not much displaced from the position of the curve 10. Namely, this curve 11, though showing a certain charge loss, provides a normal data as it is not lowered below the evaluation reference value $V_{READ}$.

On the other hand, the curve 12 shows an example of the memory cell with defective data storage characteristics (defective memory cell). The curve is significantly displaced from the position of the curve 10, because the loss of the accumulated charge exceeds a predetermined amount. Consequently, it is possible to discriminate whether the memory cell is satisfactory or defective, by evaluating the change of the drain current $I_D$, utilizing the voltage $V_{READ}$ as the evaluation reference value.

However, in such conventional test method, as the data writing in the step S1 is executed by the application of the rated voltage $V_1$ as the gate voltage $V_G$ to the gate terminal 2, a large amount of charge is accumulated in the floating gate 5 of the memory cell 1. With such large amount of accumulated charge, even if the position of the $V_G$-$I_D$ characteristics curve is displaced, the threshold of the $V_G$-$I_D$ characteristics may not move below the reference voltage $V_{READ}$ used for discriminating the data read-out in certain memory cells, so that the detection of the defective memory cells may become impossible.

Also if the high-temperature standing is extended until the curve of the $V_G$-$I_D$ characteristics comes below the position of the voltage $V_{READ}$ in order to securely detect the defective memory cell, there is required a considerably long time, leading to a low work efficiency.

SUMMARY OF THE INVENTION

In consideration of the foregoing, the object of the present invention is to provide a test method for the data storage characteristics of the memory, capable of improving the efficiency of detecting a memory with defective data storage characteristics, thereby reducing the time required for the test and improving the work efficiency.

The above-mentioned object can be attained, according to an embodiment of the present invention, by a test method for the data storage characteristics of an electrically rewritable memory comprising:

a step A of writing test data into the memory by applying a voltage lower than the rated voltage;

a step B of executing a time-dependent deterioration test for the test data for a predetermined period, on the memory in which the test data are written; and a step C of reading the test data from the memory after the test and investigating the storage characteristics of the test data.

DETAILED DESCRIPTION OF THE PREFERRED EMBODIMENTS

Now the present invention will be clarified in detail by a preferred embodiment with reference to the appended drawings.

Figure 1:
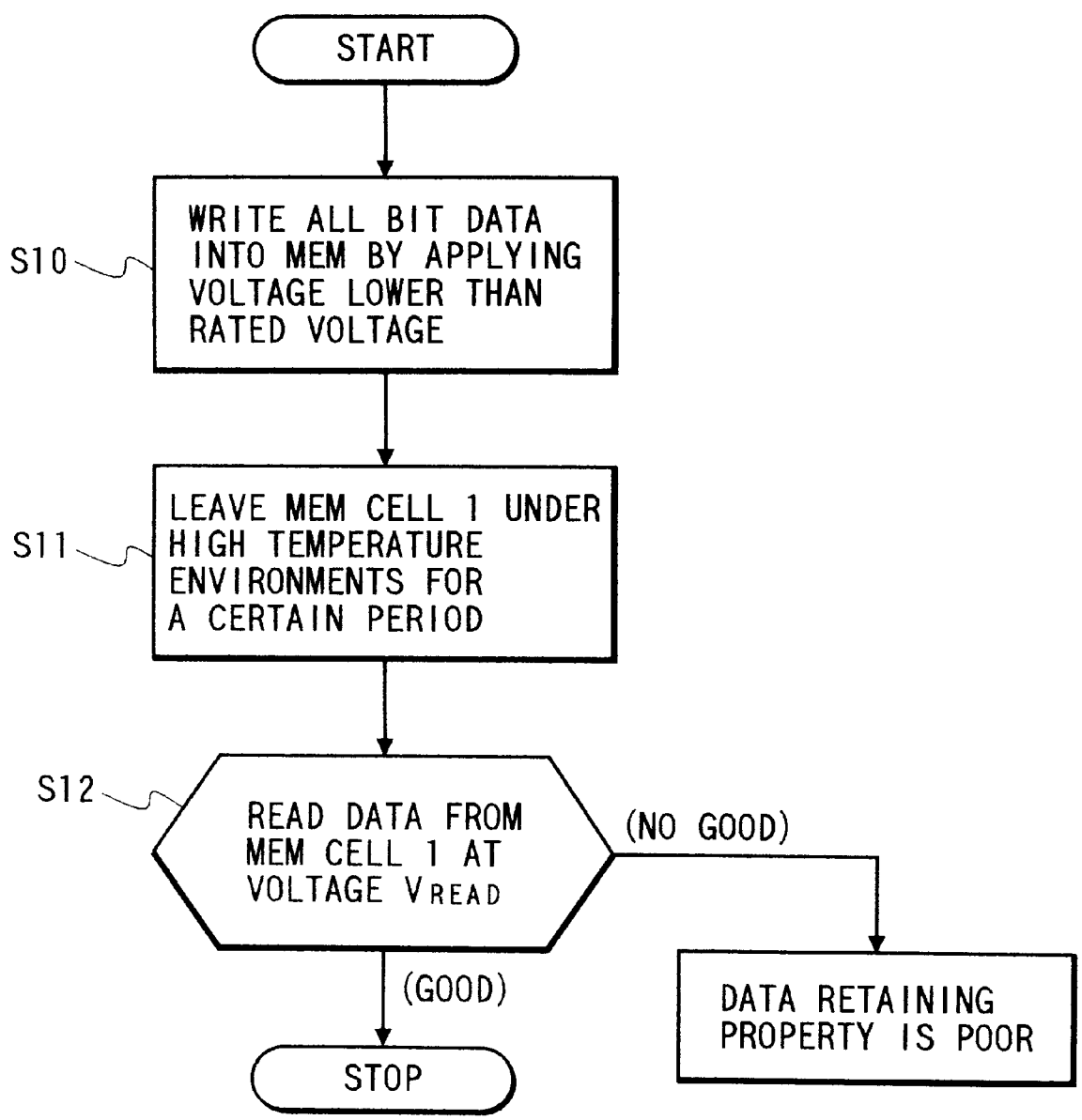
FIG. 1 is a flow chart showing the test method for the data storage characteristics applied to an electrically rewritable memory and constituting an embodiment of the present invention.
Figure 2:
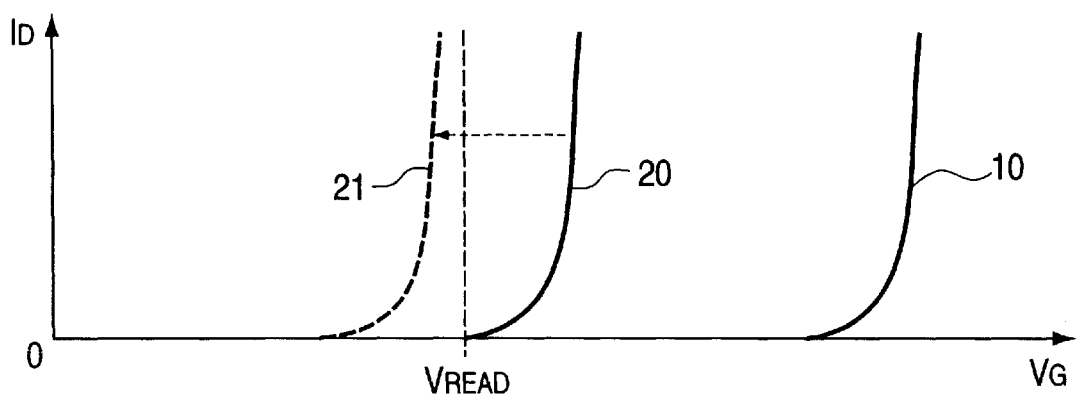
FIG. 2 is a chart showing the gate voltage-drain current characteristics in a memory at the data writing with a voltage lower than the rated voltage and after a charge loss.
Figure 3:
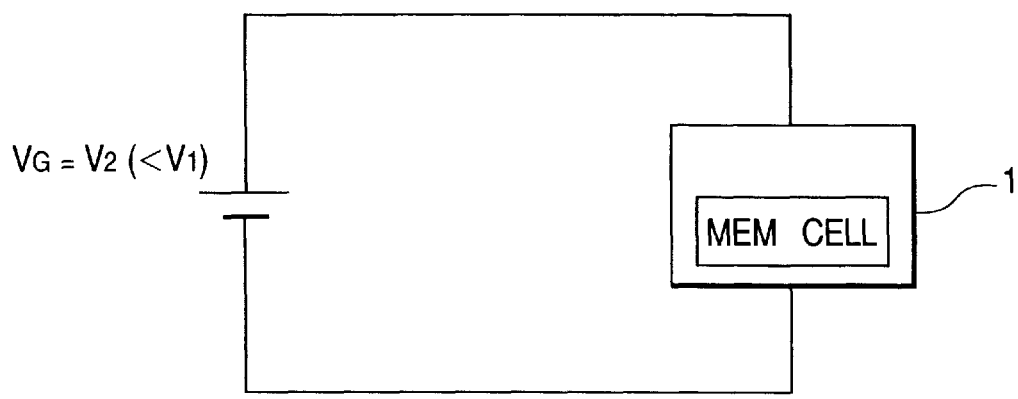
FIG. 3 is a circuit diagram showing a circuit for applying a voltage in data writing, lower than the rated voltage.
Figure 4:
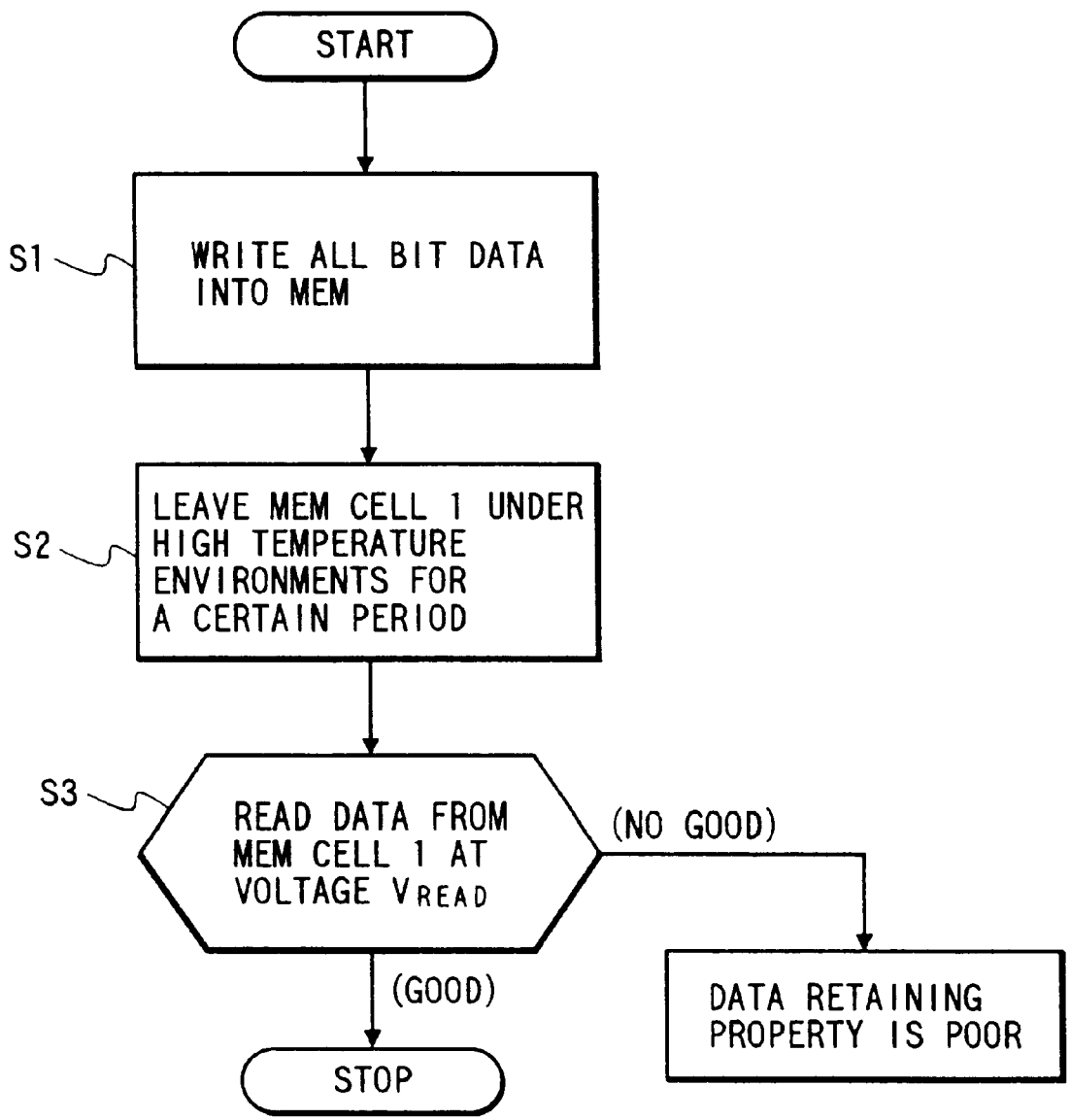
FIG. 4 is a flow chart showing a conventional test method for the data storage characteristics for an electrically rewritable memory.
Figure 5:
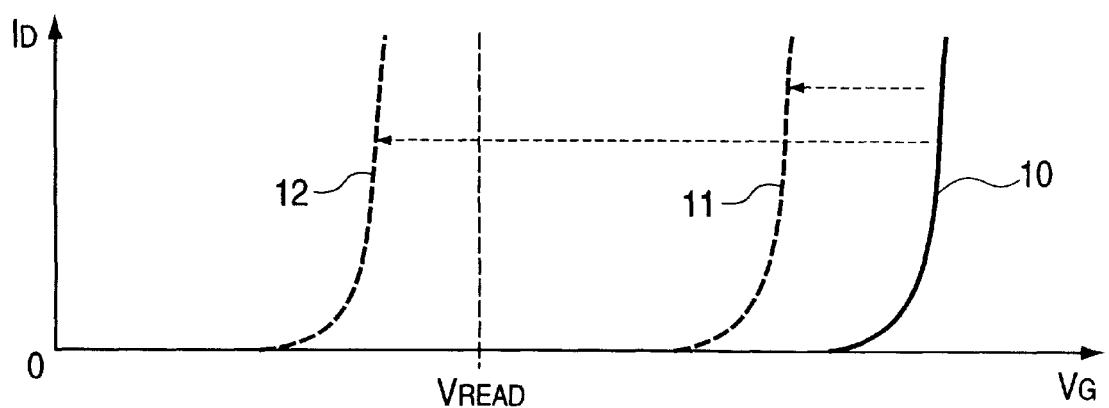
FIG. 5 is a chart showing the gate voltage-drain current characteristics in a memory at the data writing with the rated voltage and after a charge loss.

FIGS. 1 to 3 illustrate an embodiment of the present invention, wherein components equivalent to those in the conventional configuration are represented by corresponding numbers and will not be explained further.

FIG. 1 shows an example of the test method for the data storage characteristics for a non-volatile memory 1 (hereinafter called a "memory cell").

Figure 6:
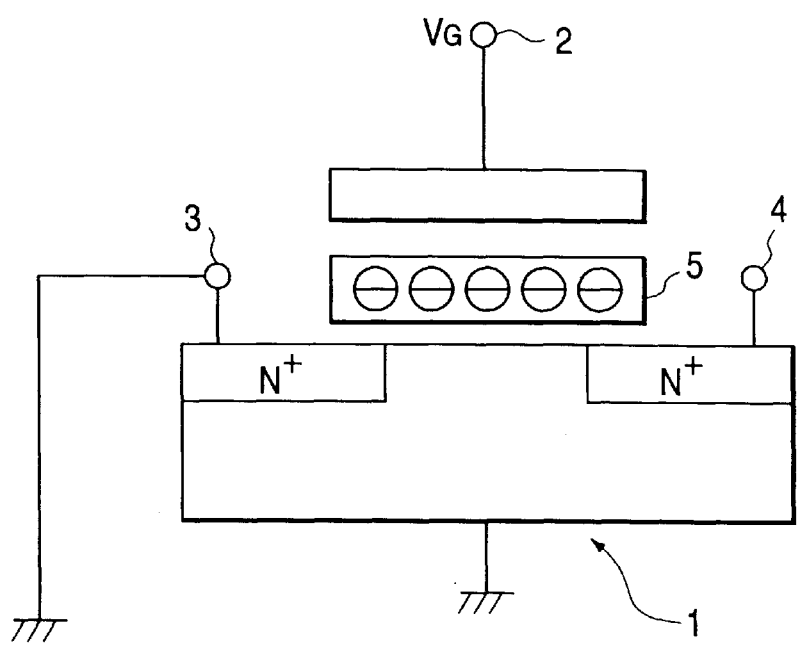
FIG. 6 is a cross-sectional view showing the state of an electrically rewritable memory at the data writing.

FIG. 3 shows a circuit for applying a voltage to the gate terminal 2 at the data writing (cf. FIG. 6), and, in this embodiment, a voltage $V_2$ lower than the rated voltage is applied as the gate voltage $V_G$. The phrase voltage $V_2$ lower that the rated voltage", as used herein means a voltage equal to or larger than a minimum level enabling the data writing or reading.

In the $V_G$–$I_D$ characteristics shown in FIG. 2, a curve 20 indicates a state after the data writing into each memory cell 1 with a voltage lower than the rated voltage according to the present invention; a curve 10 indicates a state after the data writing with the rated voltage in the conventional method; and a curve 21 indicates a state after the high-temperature standing test on the memory cell 1 with the data writing as indicated by the curve 20.

In the following, the test method for the memory cell 1 will be explained with reference to FIG. 1. A step S10 executes data writing into the floating gate 5 of the memory cell 1 by applying a voltage lower than the rated voltage to the gate terminal 2 (cf. FIG. 6). In this operation, the data writing of all the bits is executed with a voltage $V_2$ lower than the rated voltage as indicated in FIG. 3. As a result of such data writing, the amount of charge accumulated in the floating gate 5 is less than if the writing were performed with the rated voltage $V_1$, so that the position of the curve 20 indicating the $V_G$–$I_D$ characteristics becomes closer to the position of the evaluation reference voltage $V_{READ}$ as shown in FIG. 2.

In a next step S11, the memory cell 1 in the state represented by the curve 20 is subjected to a high temperature standing test (time-dependent deterioration test) in which the memory cell is let to stand in a high temperature environment for a predetermined period to accelerate the loss of the charge accumulated in the floating gate 5.

Figure 7:
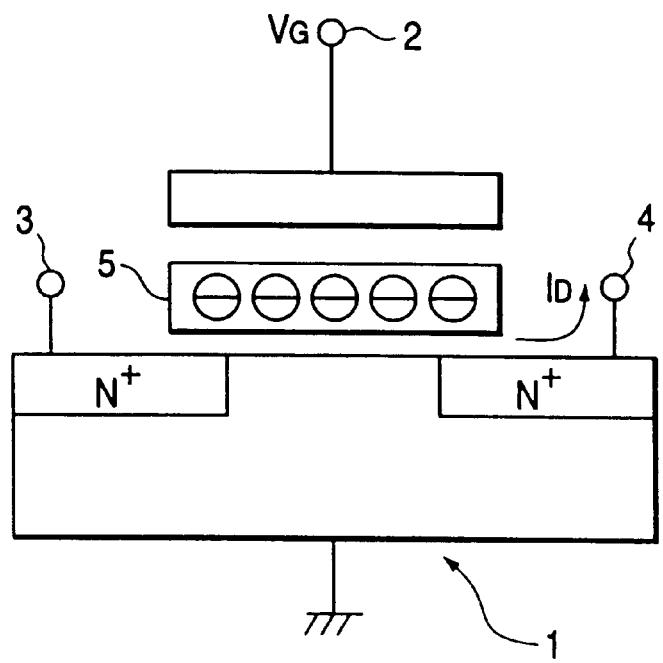
FIG. 7 is a cross-sectional view showing the state of an electrically rewritable memory at the data reading.
Figure 8:
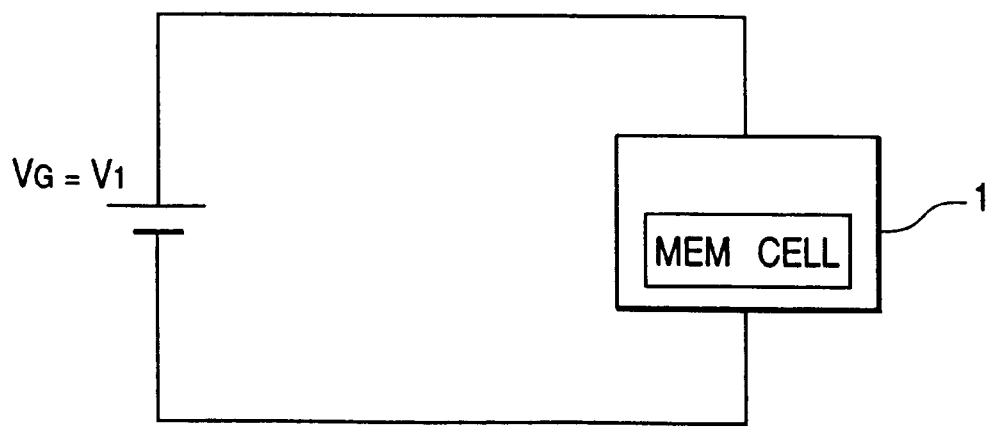
FIG. 8 is a circuit diagram showing a conventional circuit for applying the voltage for data writing.

Then a step S12 judges the data reading with the voltage $V_{READ}$ (cf. FIG. 7). A memory cell 1 with the satisfactory data storage characteristics scarcely shows the loss of the charge from the floating gate 5, so that the $V_G$–$I_D$ characteristic curve remains at the position 20. On the other hand, in a memory cell 1 with the defective data storage characteristics, the charge is lost in excess of a predetermined amount from the floating gate 5, so that the $V_G$–$I_D$ characteristic curve shows a significant change as represented by a curve 21.

In the actual data reading operation, a normal data can be read from the curve 20 as its threshold is positioned higher than the voltage $V_{READ}$, whereby the memory cell can be identified as satisfactory. On the other hand, a normal data cannot be read from the curve 21 as its threshold is positioned lower than the voltage $V_{READ}$, whereby the memory cell can be identified as defective. In this manner it is rendered possible to detect the defective memory in a shorter time than in the conventional method, by executing the data writing in all the bits with a voltage lower than the rated voltage.

Also, such data writing using a voltage lower than the rated voltage allows one to securely detect the defective memory even if the amount of loss of the charge is less than usual, so that the period of high-temperature standing can also be reduced.

The present embodiment has been described to be applied to an EEPROM with a rated voltage of 1.5 V, but such embodiment is not restrictive and the rated voltage is variable according to the type of memory.

Also, the foregoing embodiment has been explained by a rewritable non-volatile memory, but the test method of the present invention is likewise applicable to a writable memory such as a PROM.

Also the foregoing embodiment has been explained by a memory prepared by the unipolar technology, but such test method is likewise applicable to a memory prepared by the bipolar technology.

As explained in the foregoing, the present invention, effecting the data writing into a nonvolatile memory with a voltage lower than the rated voltage, allows to improve the detection efficiency for the memory cell with defective data storage characteristics.

Also as the data writing is executed with a voltage lower than the rated voltage in such a manner that the threshold of the $V_G$–$I_D$ characteristics is positioned in the vicinity of the voltage $V_{READ}$, the defective memory cell can be securely detected even if the amount of loss of the charge is less than in the usual case. It is therefore rendered possible to reduce the standing time in the high temperature environment and to improve the work efficiency.

What is claimed is:

1. A test method for the data storage characteristics of an electrically writeable memory, comprising:

a determining step, of determining a predetermined gate voltage lower than the rated voltage in such a manner that the threshold of a $V_G$–$I_D$ characteristic curve, representing the drain current $I_D$ as a function of the gate voltage $V_G$, is positioned in the vicinity of an evaluation reference voltage and that the predetermined gate voltage is equal to or larger than a minimum level allowing data writing or reading;

a writing step, of writing test data to the memory by applying the predetermined gate voltage to a gate of the memory;

a test execution step, of executing, for a predetermined period, a test of time-dependent deterioration of said test data on the memory in which said test data have been written;

a reading step, of reading said test data from the memory by detecting the drain current at the evaluation reference voltage after said test; and a judgment step, of judging that the memory is defective if the test data cannot be normally read out from the memory in said reading step.

2. A test method for the data storage characteristics of the memory according to claim 1, wherein the memory is a non-volatile memory.

3. A test method for the data storage characteristics of the memory according to claim 1, wherein a positive voltage is applied to said gate thereby accumulating a negative charge in a floating gate.

4. A test method for the data storage of a memory according to claim 1, wherein said test execution step includes executing said time-dependent deterioration test by letting the memory stand in a high temperature environment for a predetermined period.

5. A test method for the data storage characteristics of a memory according to claim 1, wherein the memory is a PROM.

6. A test method for the data storage characteristics of a memory according to claim 1, wherein the memory is rewritable.

* * * * *